(12) United States Patent
Glaser et al.

(10) Patent No.: US 10,971,488 B2
(45) Date of Patent: Apr. 6, 2021

(54) ACTIVE ESD CLAMP DEACTIVATION

(71) Applicant: Infineon Technologies AG, Neubiberg (DE)

(72) Inventors: Ulrich Glaser, Putzbrunn (DE); Thorsten Hinderer, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 588 days.

(21) Appl. No.: 15/890,102

(22) Filed: Feb. 6, 2018

(65) Prior Publication Data

US 2019/0244951 A1    Aug. 8, 2019

(51) Int. Cl.

| | | |
|---|---|---|
| *H02H 9/00* | (2006.01) | |
| *H01L 27/02* | (2006.01) | |
| *H01L 23/60* | (2006.01) | |
| *H02H 9/04* | (2006.01) | |

(52) U.S. Cl.
CPC .......... *H01L 27/0255* (2013.01); *H01L 23/60* (2013.01); *H01L 27/0259* (2013.01); *H01L 27/0285* (2013.01); *H02H 9/041* (2013.01); *H02H 9/043* (2013.01); *H02H 9/046* (2013.01)

(58) Field of Classification Search
None
See application file for complete search history.

(56) References Cited

U.S. PATENT DOCUMENTS

| | | |
|---|---|---|
| 5,057,721 A | 10/1991 | Miyazaki et al. |
| 5,444,591 A | 8/1995 | Chokhawala et al. |
| 6,690,555 B1 * | 2/2004 | Pasqualini .......... H01L 27/0266 361/56 |
| 8,643,990 B2 | 2/2014 | Cao et al. |
| 8,760,829 B2 | 6/2014 | Wang et al. |
| 9,225,163 B2 | 12/2015 | Cao et al. |
| 9,413,166 B2 | 8/2016 | Rupp et al. |
| 9,438,030 B2 * | 9/2016 | Stockinger ....... H03K 19/00315 |
| 10,218,171 B2 | 2/2019 | Zhu et al. |

(Continued)

FOREIGN PATENT DOCUMENTS

| | | |
|---|---|---|
| CN | 101483339 A | 7/2009 |
| CN | 101834436 A | 9/2010 |

(Continued)

OTHER PUBLICATIONS

Office Action, in the Chinese language, from counterpart Chinese Application No. 201910108914.2, dated Dec. 30, 2020, 7 pp.

*Primary Examiner* — Stephen W Jackson
(74) *Attorney, Agent, or Firm* — Shumaker & Sieffert, P.A.

(57) ABSTRACT

A circuit includes electrostatic discharge (ESD) protection circuitry, triggering circuitry, transient detection circuitry, and deactivation circuitry. The ESD protection circuitry is coupled between a first rail and a second rail. The triggering circuitry is configured to generate an ESD activation signal when a voltage across the first rail and the second rail exceeds a voltage threshold. The ESD protection circuitry is configured to activate based on the ESD activation signal. The transient detection circuitry is configured to generate a deactivation signal when the voltage across the first rail and the second rail comprises a voltage change over time that is less than a transient threshold. The deactivation circuitry is configured to deactivate the triggering circuitry based on the deactivation signal.

20 Claims, 12 Drawing Sheets

(56) References Cited

U.S. PATENT DOCUMENTS

| | | |
|---|---|---|
| 2004/0095699 A1 | 5/2004 | Kohno |
| 2009/0296291 A1 | 12/2009 | Volke |
| 2015/0124359 A1 | 5/2015 | Cao et al. |
| 2016/0336308 A1 | 11/2016 | Esmark et al. |
| 2018/0006448 A1 | 1/2018 | Glaser et al. |

FOREIGN PATENT DOCUMENTS

| | | |
|---|---|---|
| CN | 104067390 A | 9/2014 |
| CN | 107546729 A | 1/2018 |
| DE | 4410978 A1 | 10/1994 |
| DE | 102010008815 A1 | 8/2011 |
| DE | 102012219969 A1 | 4/2014 |
| DE | 102014115583 A1 | 5/2015 |
| DE | 102015107680 A1 | 11/2016 |
| EP | 2256806 A2 | 12/2010 |
| JP | 2005295753 A | 10/2005 |
| WO | 2011101356 A1 | 8/2011 |

\* cited by examiner

ACTIVE ESD CLAMP DEACTIVATION

TECHNICAL FIELD

This disclosure relates to electronics and, more particularly, relates to electrostatic discharge protection circuitry utilizing active clamps.

BACKGROUND

To prevent damage caused by electrostatic discharge (ESD), electronics manufacturers often include ESD protection circuitry in electronic devices and components such as integrated circuits (ICs) and printed circuit boards (PCBs). An IC with a ground pin and cascaded voltage pins (i.e. pins with different supply voltages), for example, may include ESD protection circuitry to protect the functional circuits between the various pin combinations from both positive and negative ESD stresses. One type of ESD protection circuitry commonly used in electronic devices is an ESD clamp. Upon detecting a voltage event across two pins (e.g., an overvoltage or voltage spike that exceeds a threshold) caused for example by an ESD event, the ESD clamp directs current caused by the voltage event away from functional circuitry, for example to a ground.

SUMMARY

In general, the disclosure is directed to techniques for electrostatic discharge (ESD) protection that provides robust ESD protection circuitry while permitting stress testing. For example, techniques of this disclosure may include deactivation circuitry to deactivate triggering circuitry for ESD protection circuitry when a voltage change over time is less than a transient threshold (e.g., during stress testing). In this way, high voltage stress testing (e.g., voltages above a nominal turn-on voltage of the ESD protection circuitry) may be performed on integrated circuits (ICs) with ESD protection circuitry.

In one example, a circuit includes ESD protection circuitry, triggering circuitry, transient detection circuitry, and deactivation circuitry. The ESD protection circuitry is coupled between a first rail and a second rail. The triggering circuitry is configured to generate an ESD activation signal when a voltage across the first rail and the second rail exceeds a voltage threshold. The ESD protection circuitry is configured to activate based on the ESD activation signal. The transient detection circuitry is configured to generate a deactivation signal when the voltage across the first rail and the second rail comprises a voltage change over time that is less than a transient threshold. The deactivation circuitry is configured to deactivate the triggering circuitry based on the deactivation signal.

In another example, a method of operating electrostatic discharge (ESD) protection circuitry for an electrical component includes generating a deactivation signal when a voltage across the first rail and the second rail comprises a voltage change over time that is less than a transient threshold and deactivating triggering circuitry based on the deactivation signal. In response to deactivating the triggering circuitry, the method includes refraining from generating, by the triggering circuitry, an ESD activation signal for activating the ESD protection circuitry for an electrical component when the voltage across the first rail and the second rail exceeds a voltage threshold.

In another example, an integrated circuit device includes an electrical component, ESD protection circuitry, triggering circuitry, transient detection circuitry, and deactivation circuitry. The ESD protection circuitry is for preventing electrostatic discharge at the electrical component. The triggering circuitry is configured to generate an ESD activation signal for activating the ESD protection circuitry when a voltage at the electrical component exceeds a voltage threshold. The transient detection circuitry is configured to generate a deactivation signal when the voltage at the electrical component comprises a voltage change over time that is less than a transient threshold. The deactivation circuitry is configured to deactivate the triggering circuitry based on the deactivation signal.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
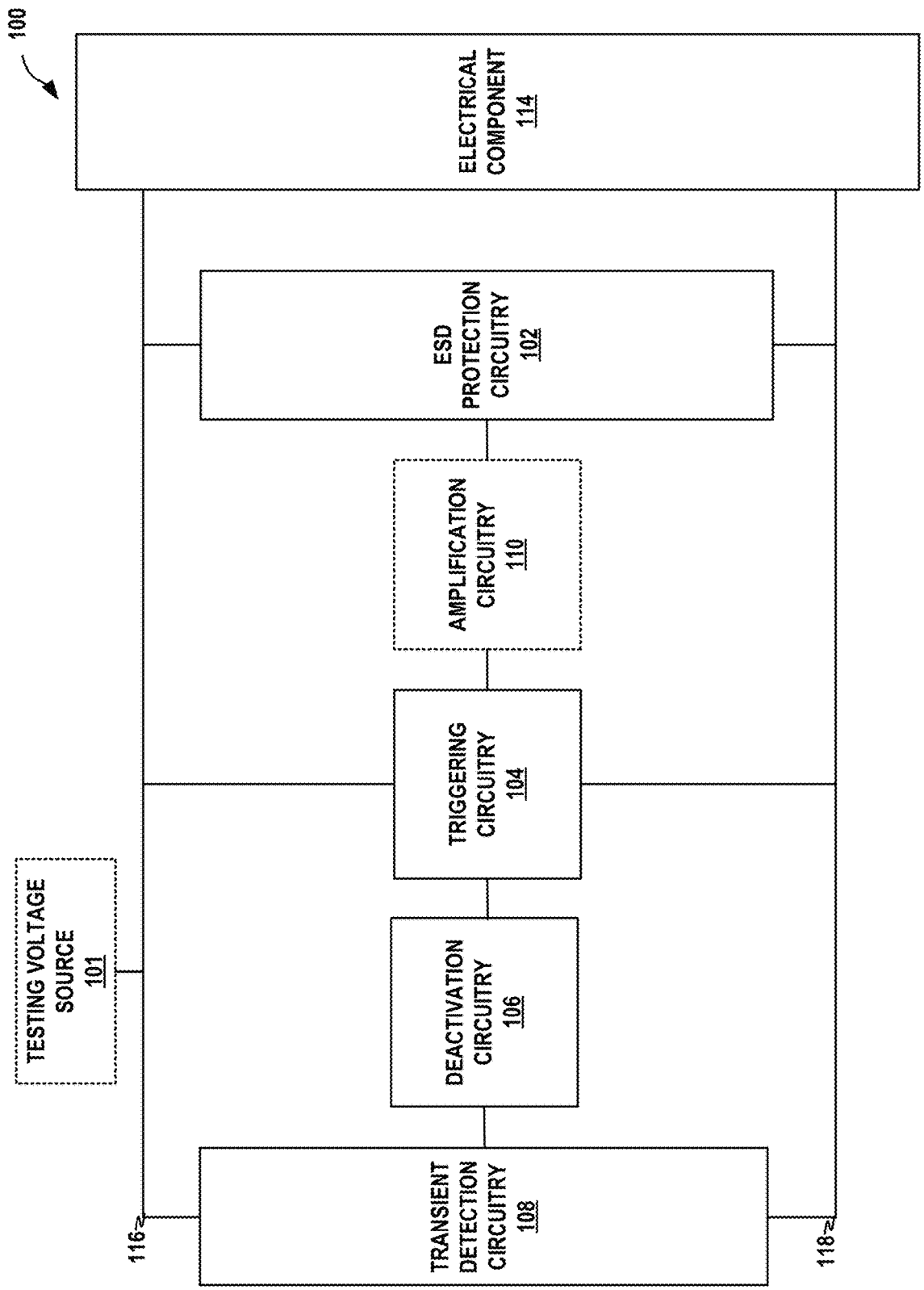
FIG. 1 is a block diagram illustrating an example electrostatic discharge (ESD) protection circuit according to one or more techniques of this disclosure.

Stress testing is a process for determining an operating life or failure modes of integrated circuits (ICs). ICs may be subject to a "burn-in" at the end of fabrication to screen out those devices which fail as a result of the initial, high failure rate portion of the IC reliability bathtub curve. Burn-in may be considered as the initial part of stress testing while stress testing incorporates all of the above-mentioned processes as well as related processes, tests and stresses.

Stress testing may be accelerated by higher temperatures and higher voltages. The acceleration may be effective for saving costs. The maximal possible stress voltage may also be limited by electrostatic discharge (ESD) protection devices which may be located at the IC pins.

For example, the desired stress voltage for stress testing an IC may be just below an absolute maximum voltage rating of the IC ($V_{amr}$). The ESD protection circuitry, however, may limit the maximal possible stress voltage to a nominal turn-on voltage of the ESD protection circuitry ($V_t$), which is less than the absolute maximum voltage rating of the IC. For example, if the ESD protection circuitry clamps (e.g., activates) when applying a stress voltage that is greater than the nominal turn-on voltage of the ESD protection circuitry, the ESD protection circuitry may invalidate the stress test because the intended stress voltage is not reached. Moreover, if the ESD protection circuitry clamps (e.g., activates) when applying a stress voltage that is greater than the nominal turn-on voltage of the ESD protection circuitry, the stress test itself may damage the ESD protection circuitry which may not be designed for DC-like stresses during an on-state (e.g., activated) of the ESD protection circuitry.

To avoid the above issues, some process may perform a stress test on an IC with a stress voltage below the turn-on voltage of the ESD protection circuitry. However, such low-voltage processes may have a long stress time (e.g., tens of hours) compared to processes that use a higher voltage (e.g., minutes, seconds, etc.), which results in higher costs in low-voltage stress testing processes compared to processes that use a higher voltage.

Some systems may use a self-protecting Double-Diffused Metal-Oxide-Semiconductor (DMOS) transistors as ESD protection circuitry. The self-protecting DMOS transistors may protect against ESD with their breakdown. As such, the nominal turn-on voltage of the ESD protection circuitry ($V_t$) may be the breakdown voltage of the DMOS transistor, which corresponds to the absolute maximum voltage rating of the IC. Using self-protecting DMOS transistors is costly because such techniques use more surface area of a substrate and/or area of an IC compared to other ESD protection circuitry, for instance, such as, but not limited to, active clamps, diodes, bipolar transistors, thyristors, or other ESD protection circuitry.

In accordance with one or more techniques described herein, an ESD protection circuitry may include a deactivation feature to active clamp ESD protection structures. The deactivation may include a switch transistor which disconnects (e.g., deactivates) the trigger circuit of the active clamp from the stressed nets. The deactivation may be activated (e.g., transistor is off) for a small voltage change over time (e.g. dV/dt<1/2 V/µs, e.g. during stress testing) and pushes the nominal turn-on voltage of the ESD protection circuitry ($V_t$) to higher values which are not limiting for the stress test anymore (e.g. above absolute maximum voltage rating of the IC ($V_{amr}$)). The deactivation feature may not diminish ESD robustness if the IC is unpowered. As such, the ESD protection circuitry may be improved by permitting a reduced time to stress test the electrical device, which results in a cost savings while providing ESD protection. While DMOS transistors may be configured with the deactivation features, various other ESD protection circuitry, for instance, such as, but not limited to, active clamps, diodes, bipolar transistors, thyristors, or other ESD protection circuitry, may be configured with the deactivation features.

FIG. 1 is a block diagram illustrating an example ESD protection circuit according to one or more techniques of this disclosure. As shown, system 100 includes ESD protection circuitry 102, triggering circuitry 104, deactivation circuitry 106, transient detection circuitry 108, and electrical component 114. System 100 may include additional components, for example, amplification circuitry 110, testing voltage source 101, or other additional components.

Electrical component 114 may include analog, digital, or analog and digital elements. In some examples, electrical component 114 may include, for example, but not limited to, one or more of microprocessors, digital memory chips, application-specific integrated circuits (ASICs), sensors, power management circuits, operational amplifiers, A/D converters, D/A converters, level shifters, serializer/deserializer, switches, interfaces, or other elements. Although FIG. 1 illustrates electrical component 114 as having only two rails (e.g., rails 116 and 118) electrical component 114 may include multiple (e.g., 2-100 connections) that each have a corresponding ESD protection circuit.

ESD protection circuitry 102 is configured to direct current caused by a voltage event away from electrical component 114. For example, ESD protection circuitry 102 may be configured to generate a channel that electronically couples first rail 116 (e.g., voltage rail) and second rail 118 (e.g., earth ground, ground plane, or a reference node). ESD protection circuitry 102 may include a pass element. As shown, ESD protection circuitry 102 may be coupled between first rail 116 and second rail 118.

Examples of pass elements may include, but are not limited to, a Silicon Controlled Rectifier (SCR), a Field Effect Transistor (FET), and a Bipolar Junction Transistor (BJT). Examples of FETs may include, but are not limited to, Junction Field-Effect transistor (JFET), Metal-Oxide-Semiconductor FET (MOSFET), dual-gate MOSFET, Fin-FETs, Insulated-Gate Bipolar Transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. Pass elements may be voltage-controlled and/or current-controlled. Examples of current-controlled pass elements may include, but are not limited to, gallium nitride (GaN) MOSFETs, BJTs, or other current-controlled elements.

Triggering circuitry 104 may be configured to generate an ESD activation signal when a voltage across first rail 116 and second rail 118 exceeds a voltage threshold. For example, triggering circuitry 104 may generate the ESD activation signal when a voltage across first rail 116 and second rail 118 exceeds a nominal turn-on voltage of the ESD protection circuitry ($V_t$) to limit the stress voltage to the nominal clamping voltage of the ESD protection circuitry (V.). Triggering circuitry 104 may include one or more triggering elements. Examples of triggering elements may include, for example, but not limited to, a Zener diode, a thyristor, a bipolar transistor, an avalanche diode, a Metal-Oxide-Semiconductor (MOS) transistor, a forward biased diode, or other triggering elements.

ESD protection circuitry 102 may activate based on the ESD activation signal output by triggering circuitry 104. For example, triggering circuitry 104 may output the activation signal into a control node (e.g., a gate) of a pass element of ESD protection circuitry 102. In this way, ESD protection circuitry 102 may activate when receiving the activation signal output by triggering circuitry 104.

In some examples, triggering circuitry 104 may optionally output the activation signal to amplification circuitry 110.

For example, amplification circuitry 110 may receive the ESD activation signal from triggering circuitry 104. In this example, amplification circuitry 110 may generate an amplified activation signal based on the ESD activation signal. In this example, amplification circuitry 110 may output the amplified activation signal to drive ESD protection circuitry 102.

Transient detection circuitry 108 may be configured to generate a deactivation signal when the voltage across first rail 116 and second rail 118 comprises a voltage change over time that is less than a transient threshold. Examples of a voltage change over time may include, but are not limited to, for example, volts-per-micro-second (e.g., V/μs), millivolts-per-microsecond (e.g., mV/μs), volts-per-nano-second (e.g., V/ns), or another voltage change over time. In some examples, a voltage change over time may refer to a positive change over time, also referred to as a "voltage rise time." In some examples, voltage change over time may refer to a negative change over time, also referred to as a "voltage fall time." As discussed further below, ESD stresses or an ESD event may have a voltage change over time (e.g., positive or negative) that is relatively fast. For example, ESD stresses or an ESD event may have a voltage change over time that is greater than 1V/10 ns. Accordingly, the transient threshold may be selected to be less than expected ESD stresses or ESD events. For example, the transient threshold may be selected to be less than 1/2 V/μs.

For example, transient detection circuitry 108 may be configured to generate a deactivation signal when the voltage across first rail 116 and second rail 118 has a slow voltage rise (e.g. dV/dt<1/2 V/μs, e.g. during stress testing). Transient detection circuitry 108 may include one or more resistance elements and/or one or more capacitors. For example, to generate the deactivation signal, transient detection circuitry 108 may be configured to charge a capacitor via a resistance element. More specifically, for example, a capacitance of a capacitor of transient detection circuitry 108 and a resistance of a resistor of transient detection circuitry 108 may each be selected such that transient detection circuitry 108 generates the deactivation signal when the voltage across first rail 116 and second rail 118 comprises a voltage change over time that is less than a transient threshold.

Deactivation circuitry 106 may be configured to deactivate the triggering circuitry 104 based on a deactivation signal. Deactivation circuitry 106 may include a switching element. Examples of switching elements may include, but are not limited to, silicon controlled rectifier (SCR), a Field Effect Transistor (FET), and bipolar junction transistor (BJT). Switching elements may be voltage-controlled and/or current-controlled. Switching elements may be voltage-controlled and/or current-controlled. Examples of current-controlled switching elements may include, but are not limited to, gallium nitride (GaN) MOSFETs, BJTs, or other current-controlled elements.

In some examples, system 100 may include testing voltage source 101 configured to provide a testing voltage at electrical component 114 to stress test electrical component 114. In some examples, voltage source 101 is configured to provide a testing voltage at electrical component 114 that exceeds a nominal turn-on voltage of ESD protection circuitry 102. For instance, testing voltage source 101 may be configured to supply a voltage that increases, at less than half of a volt per microsecond, from an operating voltage of electrical component 114 to an absolute maximum rating ($V_{amr}$) for electrical component 114.

In accordance with one or more techniques described herein, transient detection circuitry 108 generates a deactivation signal when a voltage across first rail 116 and second rail 118 includes a voltage change over time that is less than a transient threshold. For instance, transient detection circuitry 108 generates a deactivation signal when the voltage across first rail 116 and second rail 118 has a slow voltage change over time (e.g. dV/dt<1/2 V/us, e.g. during stress testing).

Deactivation circuitry 106 deactivates triggering circuitry 104 based on the deactivation signal. For example, in response to receiving the deactivation signal, deactivation circuitry 106 decouples triggering circuitry from first rail 116. In response to deactivating the triggering circuitry, triggering circuitry 104 refrains from generating an ESD activation signal for activating ESD protection circuitry 102 for an integrated circuit device when the voltage across first rail 116 and second rail 118 exceeds a voltage threshold. For example, while deactivation circuitry 106 deactivates triggering circuitry 104, triggering circuitry 104 does not generate an ESD activation signal when the voltage across first rail 116 and second rail 118 exceeds a nominal turn-on voltage of ESD protection circuitry 102.

However, while deactivation circuitry 106 does not deactivate triggering circuitry 104, triggering circuitry 104 generates the activation signal when the voltage across first rail 116 and second rail 118 exceeds the nominal turn-on voltage of ESD protection circuitry 102. In this way, system 100 may be improved by configuring ESD protection circuitry 102 to remain deactivated during slow voltage changes over times (e.g. dV/dt<1/2 V/μs, e.g. during stress testing) while protecting electrical component 114 during fast voltage changes over times (dV/dt>1V/10 ns, e.g. ESD event).

Figure 2:
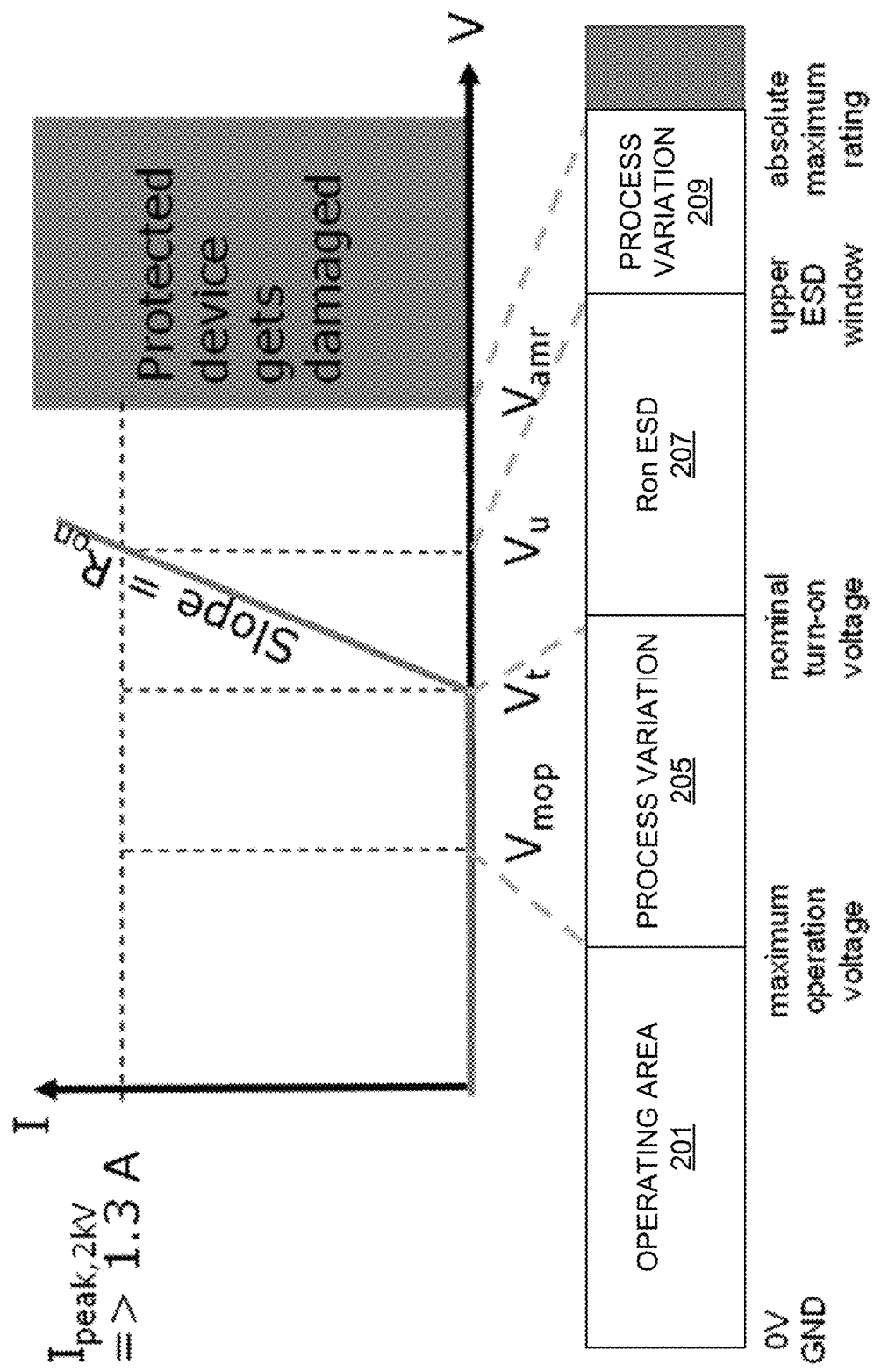
FIG. 2 is a schematic diagram illustrating the IV-characteristic of an ESD protection circuit and its impact on voltages for stress testing.

FIG. 2 is a schematic diagram illustrating the IV-characteristic of an ESD protection circuit and its impact on voltages for stress testing. The abscissa axis (e.g., horizontal) of FIG. 2 represents a voltage across rails 116 and 118 of FIG. 1 and the ordinate axis (e.g., vertical) of FIG. 2 represents current at ESD protection circuitry 102. FIG. 2 is discussed with reference to system 100 of FIG. 1 for exemplary purposes only.

As shown, the operating area 201 extends from a ground (e.g., 0 volts) to the maximum normal operation voltage ($V_{mop}$) of the electrical component 114. Process variation 205 extends from the maximum normal operation voltage ($V_{mop}$) of the electrical component 114 to a nominal turn-on voltage ($V_t$) of the ESD protection circuitry 102. In some examples, process variation 205 may be used to help to ensure that ESD protection circuitry 102 does not influence normal operation of electrical component 114 for various operational parameters (e.g., process variability and temperature dependence of $V_t$, etc.). That is, for example, ESD protection circuitry 102 may be configured to remain deactivated up to the nominal turn-on voltage ($V_t$) to ensure that ESD protection circuitry 102 is deactivated for operating area 201 (e.g., $V<=V_{mop}$).

The Ron ESD 207 extends from the nominal turn-on voltage (Vt) to the nominal clamping voltage (Vu) of ESD protection circuitry 102 for the target ESD stress. As shown, in Ron ESD 207, current flows at ESD protection circuitry 102. Process variation 209 extends from the clamping voltage (Vu) of ESD protection circuitry 102 to the absolute maximum rating $V_{amr}$ of electrical component 114. In the example of FIG. 2, electrical component 114 may be damaged by voltages above the absolute maximum rating $V_{amr}$. Process variation 209 may help to guarantee the target ESD robustness for the allowed process variability.

The desired stress voltage is just below $V_{amr}$. As previously discussed, in some systems, ESD protection circuitry, however, limits the maximal possible stress voltage to Vt. One or more techniques described herein include a deactivation feature in active clamp ESD protection structures. For example, deactivation circuitry 106 may disconnect triggering circuitry 104 of the active clamp from the stressed nets for a small voltage change over time (e.g. dV/dt<1/2 V/μs), thereby pushing the turn-on voltage $V_t$ to higher values and enabling higher stress test voltages. In some examples, deactivation circuitry 106 may be configured to operate when system 100 is unpowered.

Figure 3:
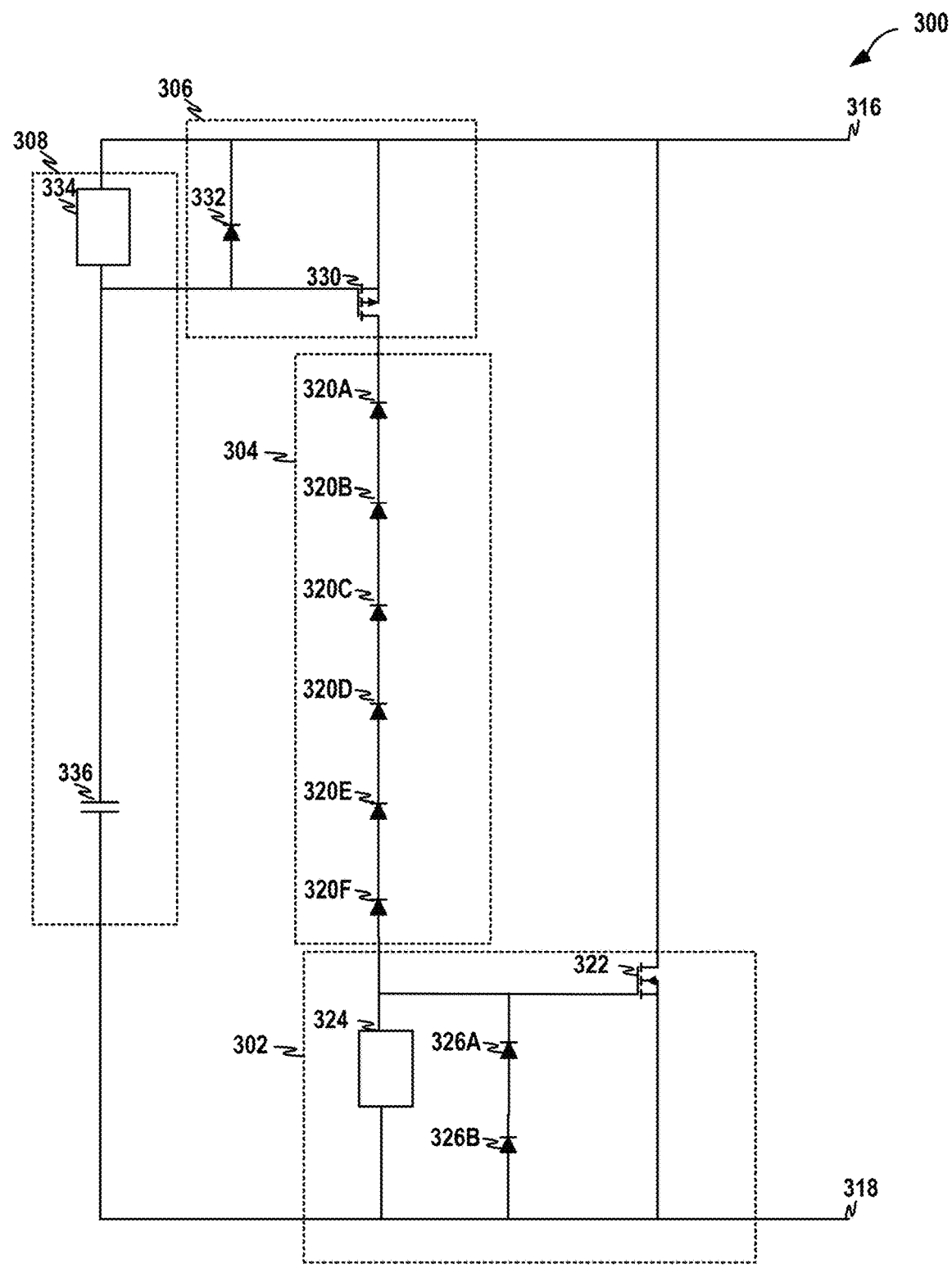
FIG. 3 is a circuit diagram illustrating a first example ESD protection circuit for a first clamp type according to one or more techniques of this disclosure.

FIG. 3 is a circuit diagram illustrating a first example ESD protection circuit 300 for a first clamp type (e.g., Type A) according to one or more techniques of this disclosure. As shown, circuit 300 may include ESD protection circuitry 302, triggering circuitry 304, deactivation circuitry 306, and transient detection circuitry 308. ESD protection circuitry 302 may be an example of ESD protection circuitry 102 of FIG. 1. Triggering circuitry 304 may be an example of triggering circuitry 104 of FIG. 1. Deactivation circuitry 306 may be an example of deactivation circuitry 106 of FIG. 1. Transient detection circuitry 308 may be an example of transient detection circuitry 108 of FIG. 1.

ESD protection circuitry 302 includes pass element 322, gate protection elements 326A-326B (collectively, gate protection elements 326), and resistance element 324. Pass element 322 includes a control node coupled to triggering circuitry 304, a first node coupled to first rail 316, and a second node coupled to second rail 318. Examples of gate protection elements 326 may include, for example, but are not limited to, a Zener diode, a thyristor, a bipolar transistor, an avalanche diode, a metal-oxide-semiconductor (MOS) transistor, a forward biased diode, or other gate protection elements. Resistance element 324 has a first node coupled to triggering circuitry 304 and a second node coupled to second rail 318. Examples of resistance element 324 may include, for example, but are not limited to, one or more resistors, one or more switching elements arranged in a series string, or another resistance element.

Triggering circuitry 304 includes triggering elements 320A-320F (collectively, triggering elements 320). As shown, triggering elements 320 are arranged in a series string that includes a first node coupled to deactivation circuitry 306 and a second node coupled to ESD protection circuitry 302. More specifically, the second node of triggering elements 320 is coupled to the first node of resistance element 324 and the control node of pass element 322.

Triggering elements 320 may be configured to generate an ESD activation signal to activate (e.g., turn-on) pass element 322 when a voltage at triggering elements 320 (e.g., across first rail 316 and second rail 318) exceeds a voltage threshold. For instance, each triggering element of triggering elements 320 may have a breakdown voltage such that a combination of breakdown voltages for triggering elements 320 corresponds to the voltage threshold. Additionally, or alternatively, triggering elements 320 include a number of triggering elements such that a combination of breakdown voltages for triggering elements 320 corresponds to the voltage threshold. In this way, triggering circuitry 304 may be configured to generate an ESD activation signal when a voltage at triggering elements 320 (e.g., across first rail 316 and second rail 318) exceeds a voltage threshold.

Deactivation circuitry 306 includes switching element 330 and gate protection element 332. Switching element 330 includes a control node coupled to transient detection circuitry 308, a first node coupled to first rail 316, and a second node coupled to triggering circuitry 304. More specifically, the second node of switching element 330 is coupled to triggering element 320A. Said differently, the second node of switching element 330 is coupled to the first node of the series string of triggering elements 320.

Transient detection circuitry 308 includes resistance element 334 and capacitor 336. As shown, capacitor 336 is coupled in series with resistance element 334. In the example of FIG. 3, a first node of capacitor 336 is coupled to the second node of resistance element 334, and the control node of switching element 330 of deactivation circuitry 306. In the example of FIG. 3, a second node of capacitor 336 is coupled to the second rail 318. In some examples, resistance element 334 may include one or more switching elements arranged in a series string. Additionally, or alternatively, resistance element 334 may include one or more resistors. In this way, transient detection circuitry 108 may be configured to charge capacitor 336 via resistance element 334. In some examples, a capacitance of capacitor 336 and a resistance value of resistance element 334 may be selected to generate a deactivation signal when the voltage across first rail 316 and second rail 318 has a small voltage change over time, e.g. a slow voltage rise (e.g. dV/dt<1/2 V/μs, e.g. during stress testing).

In the example of FIG. 3, switching element 330 connects triggering elements 320 to first rail 316 (e.g., a cathode in case of type A). Switching element 330 may help to prevent current flow through triggering circuitry 304 (e.g., the series string of triggering elements 320) if switching element 330 is turned off until switching element 330 reaches a break down voltage for switching element 330.

Capacitor 336 of transient detection circuitry 308 may have Zener diodes (or other triggering elements) in series (not shown). These Zener diodes may reduce the discharge of kgate (e.g., a charge stored at a capacitance at a gate of switching element 330) during the falling edge of the ESD stress to help to keep the active clamp in its on-state longer. These Zener diodes, however, may also lead to a remaining voltage across capacitor 336 after an ESD stress. As such, the blocking voltage may not be configured to be too high because such a configuration may reduce the effect of the combination of resistance element 334 and capacitor 336 of transient detection circuitry 308 in case of a second ESD stress.

Figure 7:
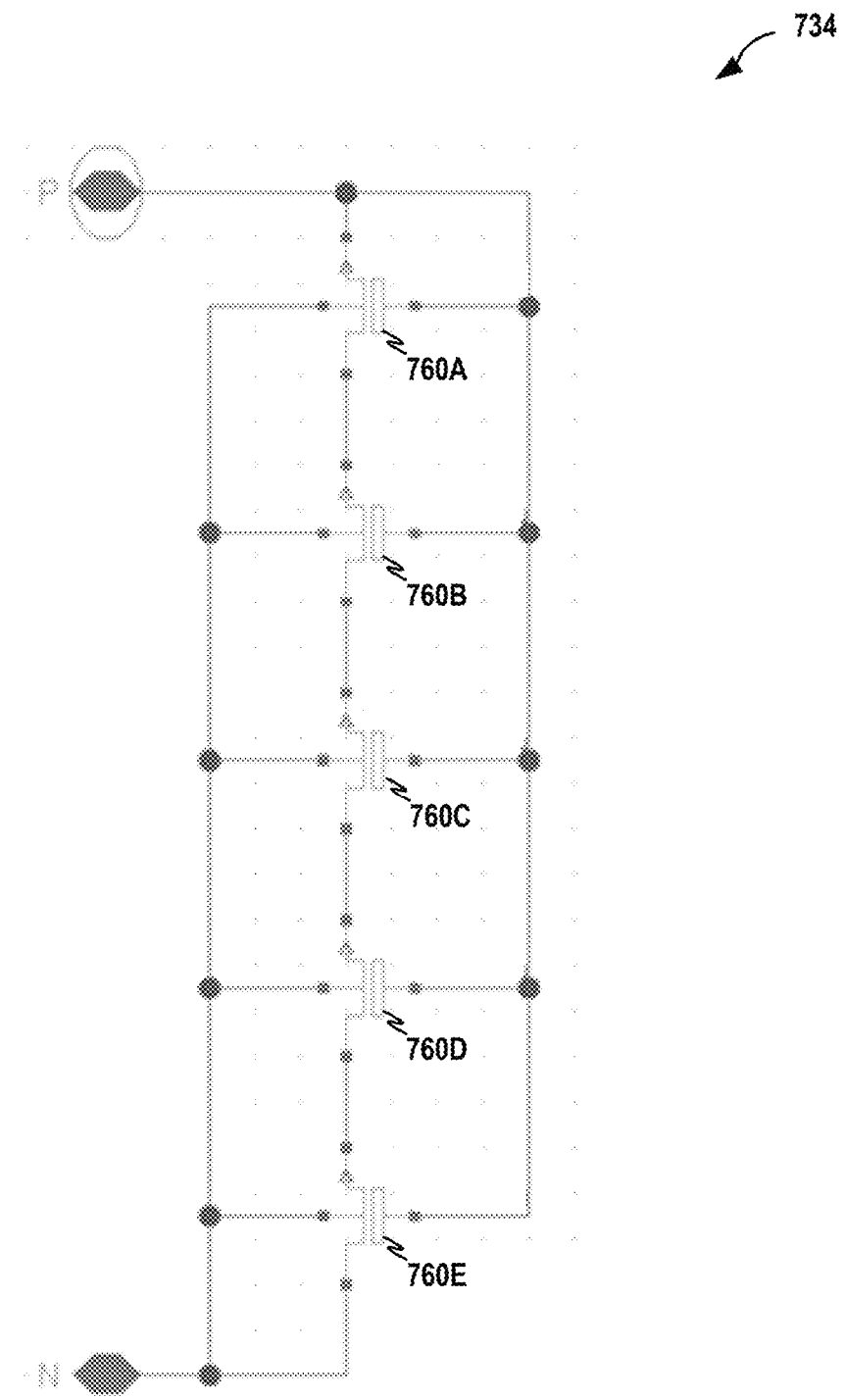
FIG. 7 is a circuit diagram illustrating a resistance element according to one or more techniques of this disclosure.

Resistance element 334 of transient detection circuitry 308 may be composed of a series of MOS transistors as shown in FIG. 7. Composing resistance element 334 of a series of MOS transistors may be an area efficient solution compared to using one or more resistors. However, resistance element 334 may be implemented using a resistor, such as, for example, poly silicon, metal, diffusion resistors, or another resistor.

Figure 4:
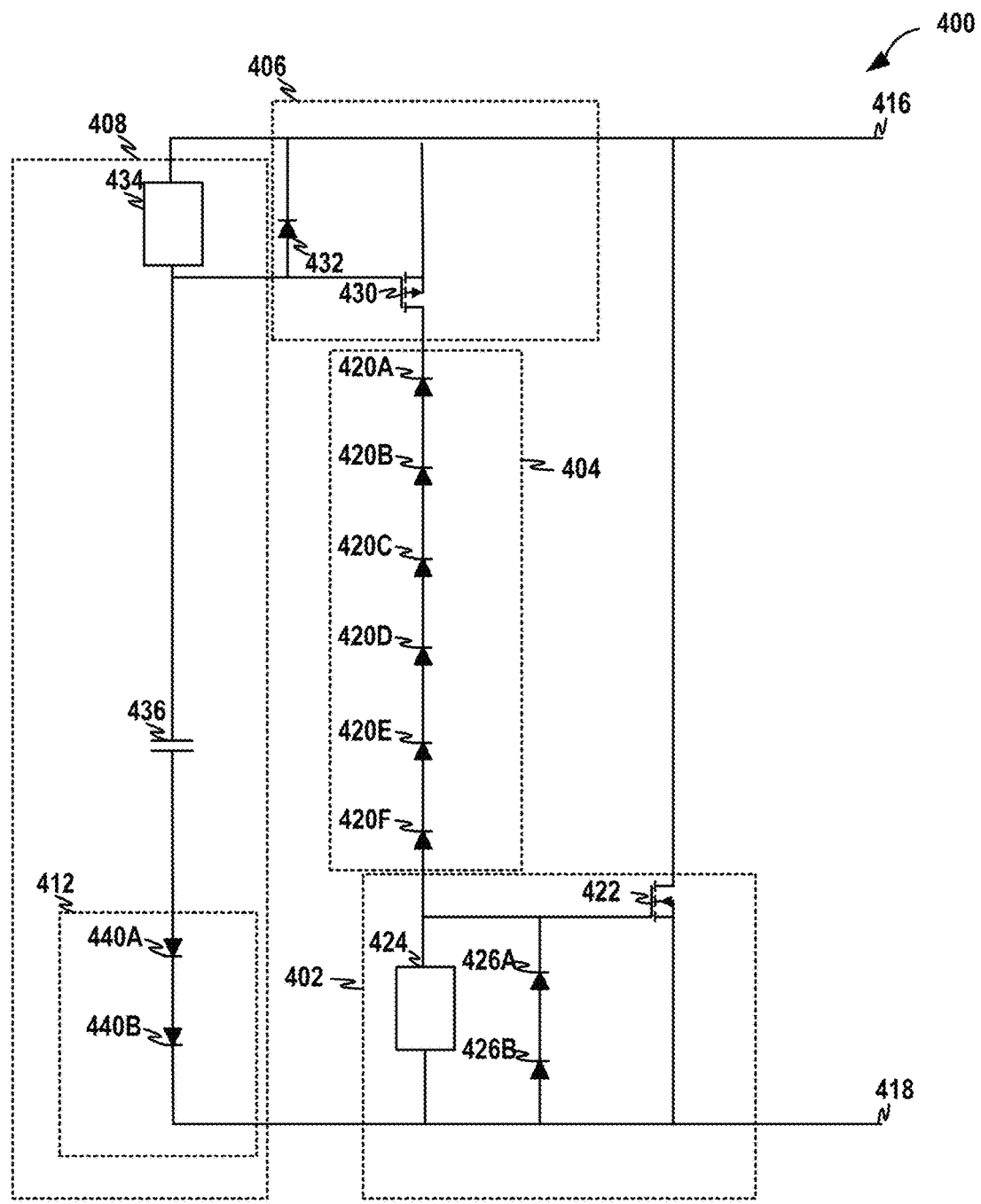
FIG. 4 is a circuit diagram illustrating a second example ESD protection circuit for the first clamp type according to one or more techniques of this disclosure.

FIG. 4 is a circuit diagram illustrating a second example ESD protection circuit 400 for the first clamp type (e.g., Type A) according to one or more techniques of this disclosure. As shown, circuit 400 may include ESD protection circuitry 402, triggering circuitry 404, deactivation circuitry 406, and transient detection circuitry 408. ESD protection circuitry 402 may be substantially similar to ESD protection circuitry 302 of FIG. 3. For example, ESD protection circuitry 402 may include pass element 422, gate protection elements 426A-426B (collectively, gate protection elements 426), and resistance element 424. Triggering circuitry 404 may be substantially similar to triggering circuitry 304 of FIG. 3. For example, triggering circuitry 404 may include triggering elements 420A-420F (collectively, triggering elements 426). Deactivation circuitry 406 may be substantially similar to deactivation circuitry 306 of FIG. 3. For example, deactivation circuitry 406 may include switching element 430 and gate protection element 432. Transient detection circuitry 408 may be an example of transient detection circuitry 108 of FIG. 1.

Similar to transient detection circuitry 308 of FIG. 3, transient detection circuitry 408 includes resistance element 434 and capacitor 436. However, transient detection circuitry 408 further includes turn-off delay circuitry 412. As shown, a second node of capacitor 436 is coupled to an input of turn-off delay circuitry 412 and an output of turn-off delay circuitry 412 is coupled to second rail 418. Turn-off delay circuitry 412 includes triggering elements 440A, 440B (collectively, triggering elements 440) arranged in a series string.

In the example of FIG. 4, switching element 430 connects triggering elements 420 to first rail 416 (e.g., a cathode in case of type A). Switching element 430 may help to prevent current flow through triggering circuitry 404 (e.g., the series string of triggering elements 420) if switching element 430 is turned off until switching element 430 reaches a break down voltage for switching element 430.

The combination of resistance element 434 and capacitor 436 controls switching element 430. In some examples, the combination of resistance element 434 and capacitor 436 helps to keep switching element 430 turned-on in case of fast transients and durations as typical for ESD stresses. In some examples, the combination of resistance element 434 and capacitor 436 turns off switching element 430, however, in case of slow transients and long durations during stress testing. Typical transients of ESD stresses may be in the range of greater than 1V/10 ns while some example transients of stress tests may be less than 10 volts per microsecond. Additionally, a duration of ESD stresses may be up to several 100 nanoseconds while a duration of stress tests may be much greater than 1 us.

Capacitor 436 of transient detection circuitry 408 may have triggering elements 440 in series. Triggering elements 440 may reduce the discharge of kgate (e.g., a charge stored at a capacitance at a gate of switching element 430) during the falling edge of the ESD stress to help to keep the active clamp in its on-state longer. Triggering elements 440, however, may also lead to a remaining voltage across capacitor 436 after an ESD stress. As such, the blocking voltage may not be configured to be too high because such a configuration may reduce the effect of the combination of resistance element 434 and capacitor 436 of transient detection circuitry 408 in case of a second ESD stress.

Figure 5:
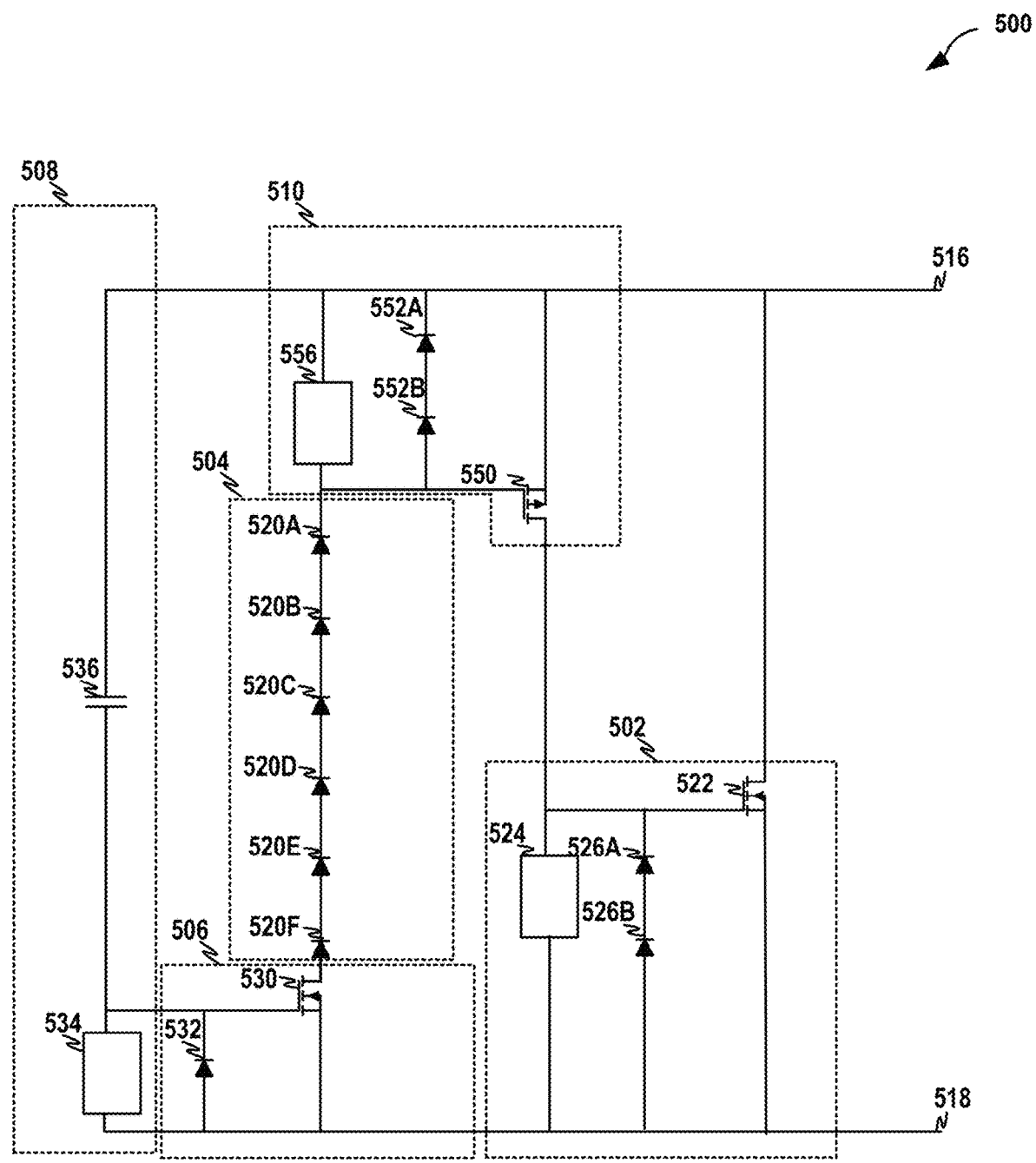
FIG. 5 is a circuit diagram illustrating a first example ESD protection circuit for a second clamp type according to one or more techniques of this disclosure.

FIG. 5 is a circuit diagram illustrating a first example ESD protection circuit 500 for a second clamp type (e.g., type B) according to one or more techniques of this disclosure. As shown, circuit 500 may include ESD protection circuitry 502, triggering circuitry 504, deactivation circuitry 506, transient detection circuitry 508, and amplification circuitry 510. ESD protection circuitry 502 may be substantially similar to ESD protection circuitry 302 of FIG. 3. For example, ESD protection circuitry 502 may include pass element 522, gate protection elements 526A-526B (collectively, gate protection elements 526), and resistance element 524. Triggering circuitry 504 may be substantially similar to triggering circuitry 304 of FIG. 3. For example, triggering circuitry 504 may include triggering elements 520A-520F (collectively, triggering elements 520). Deactivation circuitry 506 may be substantially similar to deactivation circuitry 306 of FIG. 3. For example, deactivation circuitry 506 may include switching element 530 and gate protection element 532. Transient detection circuitry 508 may be substantially similar to transient detection circuitry 308 of FIG. 3. For example, transient detection circuitry 508 may include resistance element 534 and capacitor 536. Amplification circuitry 510 may be an example of amplification circuitry 110 of FIG. 1.

Amplification circuitry 510 includes resistance element 556, gate protection elements 552A-552B (collectively, gate protection elements 552), and switching element 550. As shown, switching element 550 includes a first node coupled to first rail 516, a second node coupled to ESD protection circuitry 502, and a control node coupled to triggering circuitry 504. More specifically, the second node of switching element 550 is coupled to resistance element 524 and a control node of pass element 522. Moreover, as shown, the control node of switching element 550 is coupled to a series string of triggering elements 520. As shown resistance element 556, includes a first node coupled to first rail 516 and a second node coupled to the control node of switching element 550.

In the example of FIG. 5, switching element 530 connects triggering elements 520 to second rail 516 (e.g., an anode in case of type B). Switching element 530 may help to prevent current flow through triggering circuitry 504 (e.g., the series string of triggering elements 520) if switching element 530 is turned off until switching element 530 reaches a break down voltage for switching element 530.

The combination of resistance element 534 and capacitor 536 controls switching element 530. In some examples, the combination of resistance element 534 and capacitor 536 helps to keep switching element 530 turned-on in case of fast transients and durations as typical for ESD stresses. In some examples, the combination of resistance element 534 and capacitor 536 turns off switching element 530, however, in case of slow transients and long durations during stress testing. Typical transients of ESD stresses may be in the range of greater than 1V/10 ns while some example transients of stress tests may be less than 10 volts per microsecond. Additionally, a duration of ESD stresses may be up to several 100 nanoseconds while a duration of stress tests may be much greater than 1 us.

Capacitor 536 of transient detection circuitry 508 may have Zener diodes (or other triggering elements) in series (not shown). These Zener diodes may reduce the discharge of kgate (e.g., a charge stored at a capacitance at a gate of switching element 530) during the falling edge of the ESD stress to help to keep the active clamp in its on-state longer. These Zener diodes, however, may also lead to a remaining voltage across capacitor 536 after an ESD stress. As such, the blocking voltage may not be configured to be too high because such a configuration may reduce the effect of the combination of resistance element 534 and capacitor 536 of transient detection circuitry 508 in case of a second ESD stress.

Figure 6:
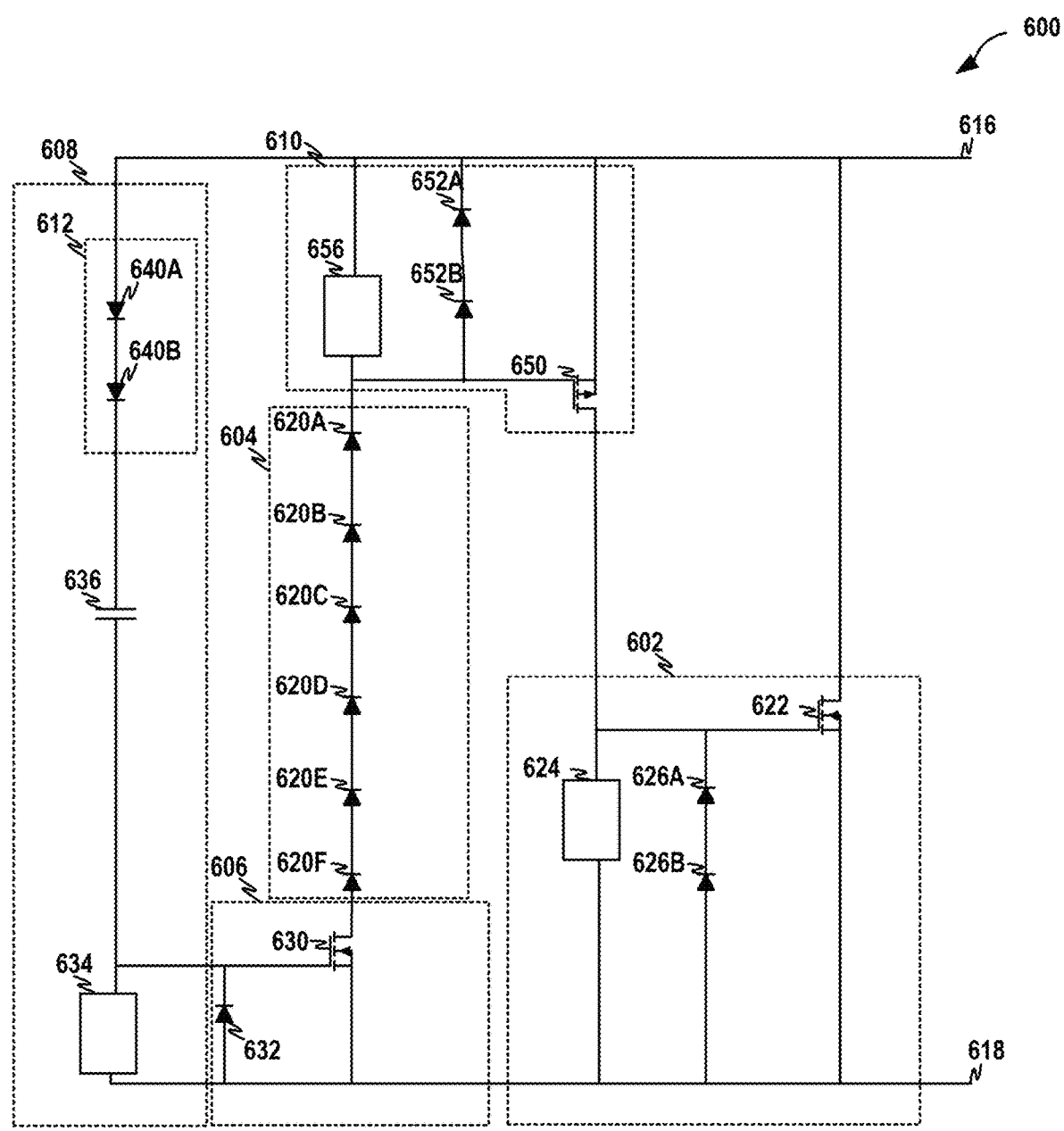
FIG. 6 is a circuit diagram illustrating a second example ESD protection circuit for the second clamp type according to one or more techniques of this disclosure.

FIG. 6 is a circuit diagram illustrating a second example ESD protection circuit 600 for the second clamp type (e.g., type B) according to one or more techniques of this disclosure. As shown, circuit 600 may include ESD protection circuitry 602, triggering circuitry 604, deactivation circuitry 606, transient detection circuitry 608, and amplification circuitry 610. ESD protection circuitry 602 may be substantially similar to ESD protection circuitry 502 of FIG. 5. For example, ESD protection circuitry 602 may include pass element 622, gate protection elements 626A-626B (collectively, gate protection elements 626), and resistance element 624. Triggering circuitry 604 may be substantially similar to triggering circuitry 504 of FIG. 5. For example, triggering circuitry 604 may include triggering elements 620A-620F (collectively, triggering elements 620). Deactivation circuitry 606 may be substantially similar to deactivation circuitry 506 of FIG. 5. For example, deactivation circuitry 606 may include switching element 630 and gate protection element 632. Amplification circuitry 610 may be substantially similar to amplification circuitry 510 of FIG. 5. For example, amplification circuitry 610 may include resistance element 656, gate protection elements 652A-652B (collectively, gate protection elements 652), and switching element 650. Transient detection circuitry 608 may be an example of transient detection circuitry 108 of FIG. 1.

Similar to transient detection circuitry 508 of FIG. 5, transient detection circuitry 608 includes resistance element 634 and capacitor 636. However, transient detection circuitry 608 further includes turn-off delay circuitry 612. As shown, a first node of capacitor 636 is coupled to an input of turn-off delay circuitry 612 and an output of turn-off delay circuitry 612 is coupled to first rail 616. Turn-off delay circuitry 612 includes triggering elements 640A-640B (collectively, triggering elements 640) arranged in a series string.

In the example of FIG. 6, switching element 630 connects triggering elements 620 to second rail 616 (e.g., an anode in case of type B). Switching element 630 may help to prevent current flow through triggering circuitry 604 (e.g., the series string of triggering elements 620) if switching element 630 is turned off until switching element 630 reaches a break down voltage for switching element 630.

The combination of resistance element 634 and capacitor 636 controls switching element 630. In some examples, the combination of resistance element 634 and capacitor 636 helps to keep switching element 630 turned-on in case of fast transients and durations as typical for ESD stresses. In some examples, the combination of resistance element 634 and capacitor 636 turns off switching element 630, however, in case of slow transients and long durations during stress testing. Typical transients of ESD stresses may be in the range of greater than 1V/10 ns while some example transients of stress tests may be less than 10 volts per microsecond. Additionally, a duration of ESD stresses may be up to several 100 nanoseconds while a duration of stress tests may be much greater than 1 us.

Capacitor 636 of transient detection circuitry 608 may have triggering elements 640 in series. Triggering elements 640 may reduce the discharge of kgate (e.g., a charge stored at a capacitance at a gate of switching element 630) during the falling edge of the ESD stress to help to keep the active clamp in its on-state longer. Triggering elements 640, however, may also lead to a remaining voltage across capacitor 636 after an ESD stress. As such, the blocking voltage may not be configured to be too high because such a configuration may reduce the effect of the combination of resistance element 634 and capacitor 636 of transient detection circuitry 608 in case of a second ESD stress.

FIG. 7 is a circuit diagram illustrating a resistance element 734 according to one or more techniques of this disclosure. As shown, resistance element 734 includes switching elements 760A-760E (collectively, switching elements 760) arranged in a series string.

Figure 8:
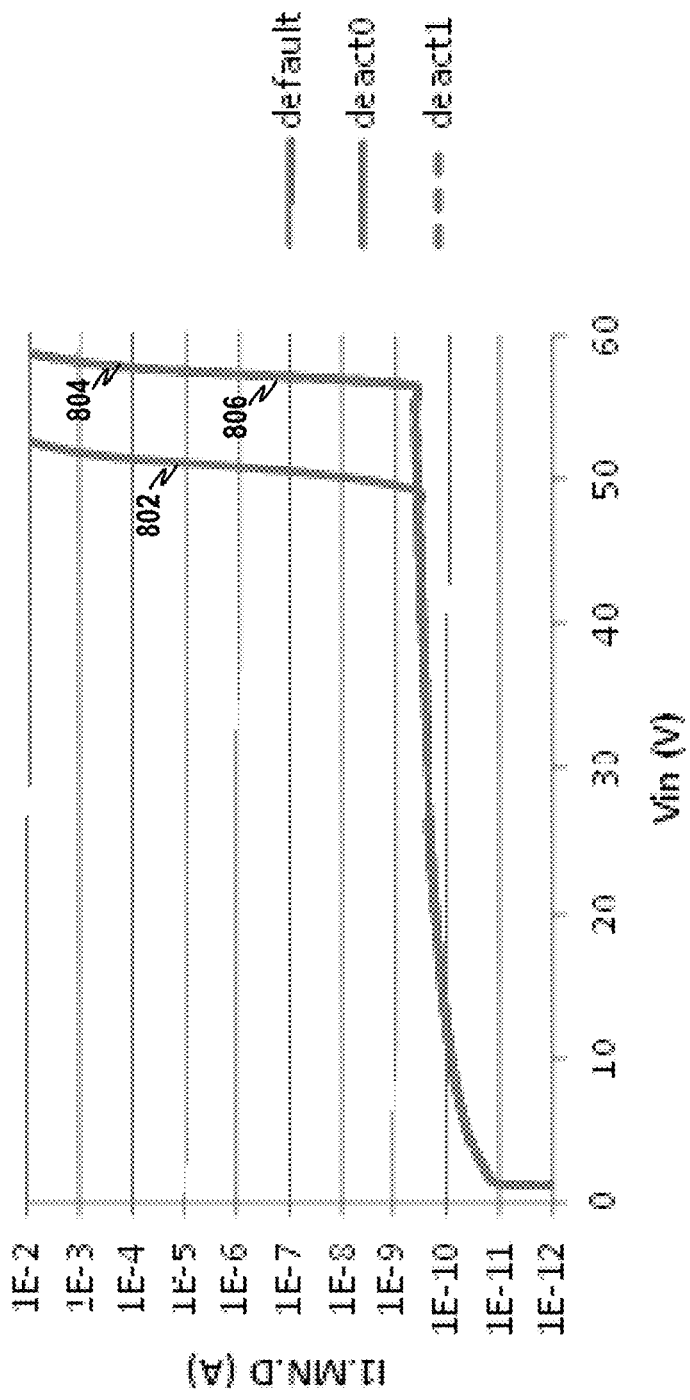
FIG. 8 is a graphical diagram illustrating direct current-voltage characteristic of a first clamp type according to one or more techniques of this disclosure.

FIG. 8 is a graphical diagram illustrating static current-voltage characteristics of a first clamp type (e.g., type A) according to one or more techniques of this disclosure. The abscissa axis (e.g., horizontal) of FIG. 8 represents a voltage across rails 116 and 118 of FIG. 1 and the ordinate axis (e.g., vertical) of FIG. 8 represents current 802 at ESD protection circuitry 102 for a system without active clamp deactivation, current 804 at ESD protection circuitry 102 for a system configured for active clamp deactivation, and current 806 at ESD protection circuitry 102 for a system configured for active clamp deactivation using turn-off delay circuitry. FIG. 8 is discussed with reference to FIGS. 1-7 for exemplary purposes only.

In the example of FIG. 8, simulated current 802 starts flowing through ESD protection circuitry 102 (e.g., pass element 322, 422, 522, 622, etc.) and triggering circuitry 104 at a trigger voltage for ESD protection circuitry 102 (~50V). However, simulated currents 804 and 806 (current 804 substantially covers current 806) starts flowing through ESD protection circuitry 102 (e.g., pass element 322, 422, 522, 622, etc.) at a 57.5V which corresponds to the drain/bulk breakdown voltage of the ESD protection circuitry 102 (e.g., pass element 322, 422, 522, 622, etc.).

Figure 9:
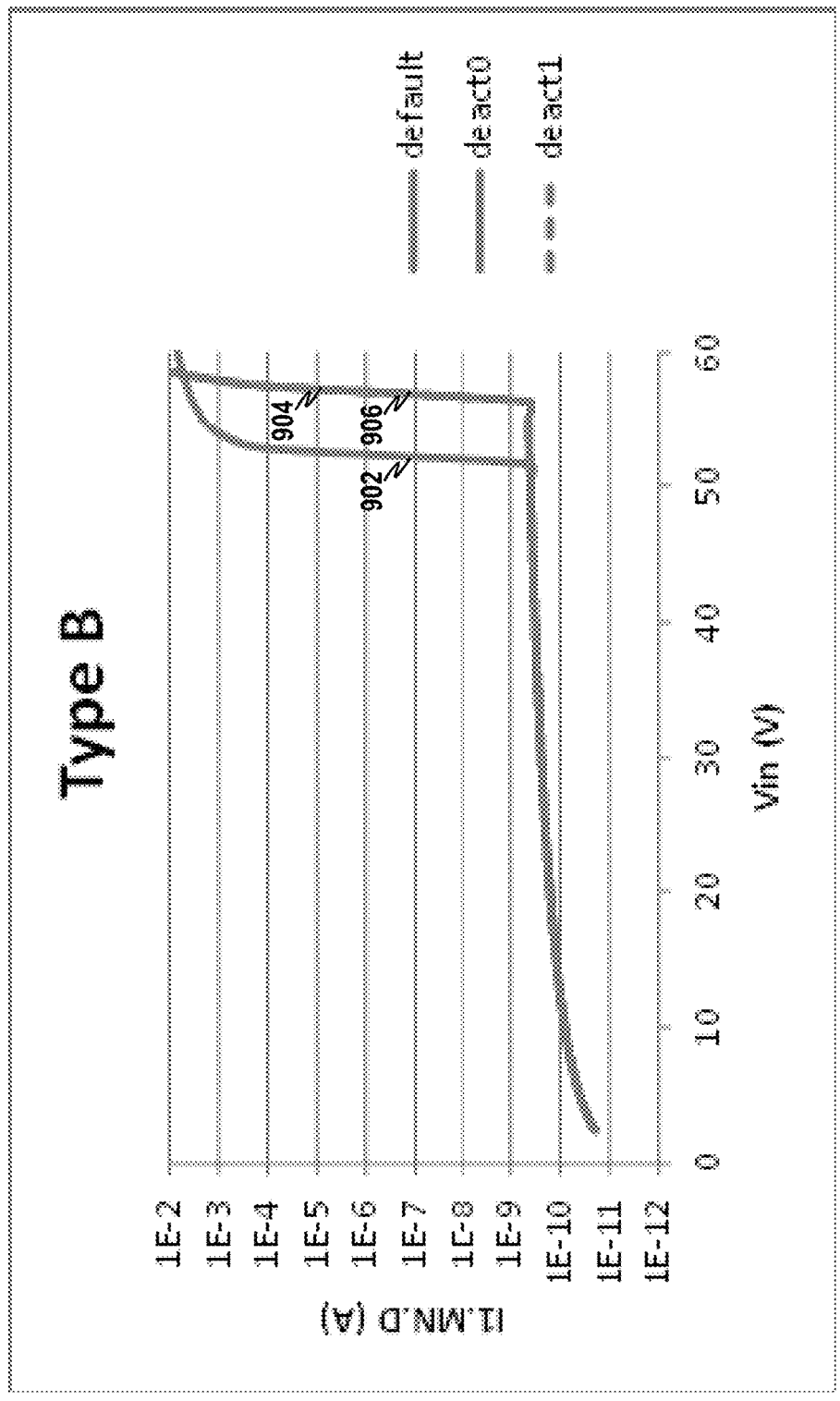
FIG. 9 is a graphical diagram illustrating direct current-voltage characteristic of a second clamp type according to one or more techniques of this disclosure.

FIG. 9 is a graphical diagram illustrating static current-voltage characteristics of a second clamp type (e.g., type B) according to one or more techniques of this disclosure. The abscissa axis (e.g., horizontal) of FIG. 9 represents a voltage across rails 116 and 118 of FIG. 1 and the ordinate axis (e.g., vertical) of FIG. 9 represents current 902 at ESD protection circuitry 102 for a system without active clamp deactivation, current 904 at ESD protection circuitry 102 for a system configured for active clamp deactivation, and current 906 at ESD protection circuitry 102 for a system configured for active clamp deactivation using turn-off delay circuitry. FIG. 9 is discussed with reference to FIGS. 1-7 for exemplary purposes only.

In the example of FIG. 9, simulated current 902 starts flowing through ESD protection circuitry 102 (e.g., pass element 322, 422, 522, 622, etc.) and triggering circuitry 104 at a trigger voltage for ESD protection circuitry 102 (~50V). However, simulated currents 904 and 906 (current 904 substantially covers current 906) starts flowing through ESD protection circuitry 102 (e.g., pass element 322, 422, 522, 622, etc.) at a 57.5V which corresponds to the drain/bulk breakdown voltage of the ESD protection circuitry 102 (e.g., pass element 322, 422, 522, 622, etc.).

Figure 10:
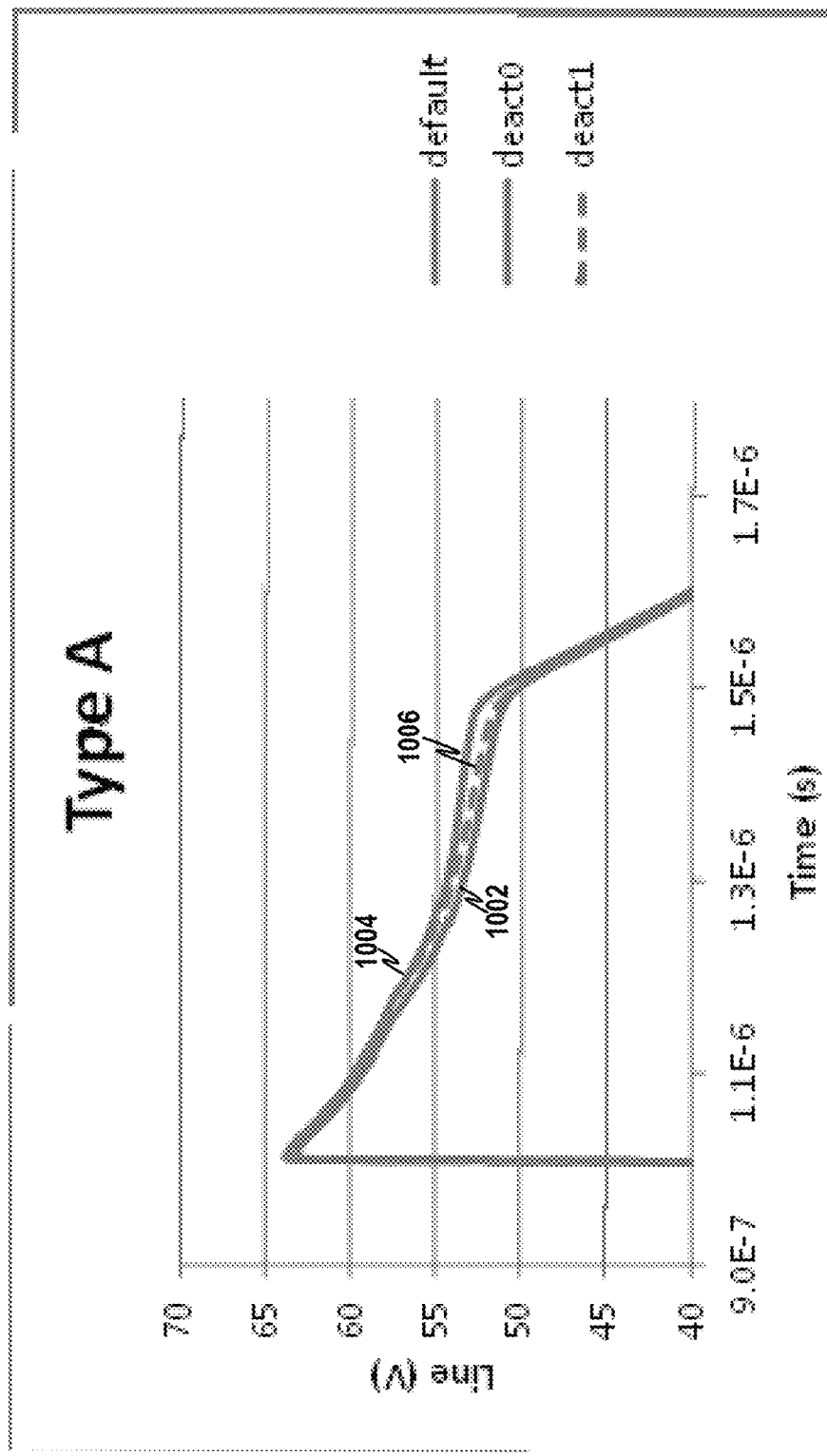
FIG. 10 is a graphical diagram illustrating a dynamic voltage drop across a first clamp type according to one or more techniques of this disclosure.

FIG. 10 is a graphical diagram illustrating a dynamic voltage response at a first clamp type (e.g., type A) according to one or more techniques of this disclosure for an ESD pulse. The abscissa axis (e.g., horizontal) of FIG. 10 represents time and the ordinate axis (e.g., vertical) of FIG. 10 represents a voltage 1002 across rails 116 and 118 of FIG. 1 for a system without active clamp deactivation, a voltage 1004 across rails 116 and 118 of FIG. 1 for a system configured for active clamp deactivation, and voltage 1006 for a system configured for active clamp deactivation using turn-off delay circuitry. FIG. 10 is discussed with reference to FIGS. 1-7 for exemplary purposes only.

The example of FIG. 10 illustrates a simulated voltage drop across the active clamps under 2 kV HBM (according to JEDEC JS-001) ESD stress. As shown, voltages 1004 and 1006 substantially correspond to voltage 1002 across rails 116 and 118 of FIG. 1 for a system without active clamp deactivation. As such, FIG. 10 illustrates that a system configured for active clamp (e.g., type A) deactivation does not exhibit a significantly different voltage drop during ESD stress compared to systems that are not configured for active clamp deactivation.

Figure 11:
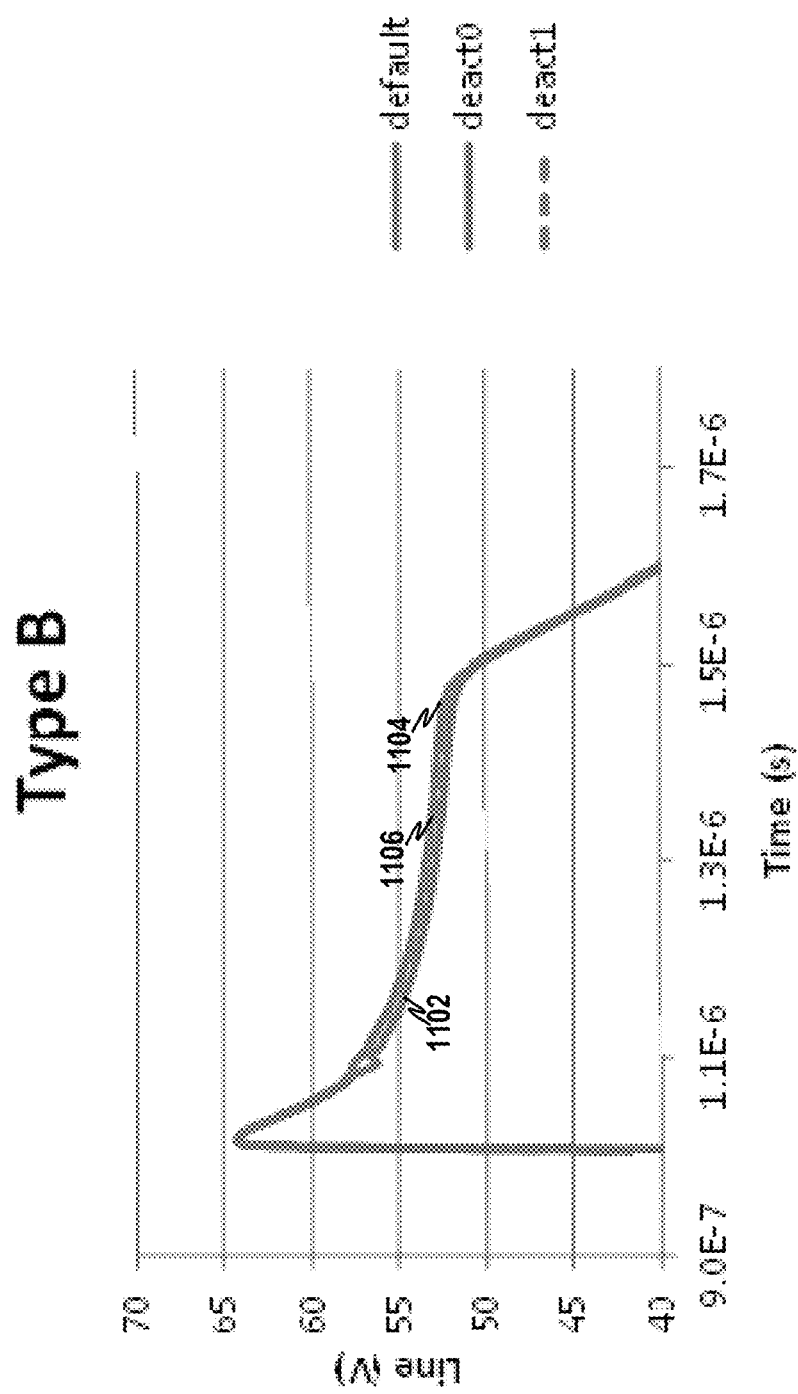
FIG. 11 is a graphical diagram illustrating a dynamic voltage drop across a second clamp type according to one or more techniques of this disclosure.

FIG. 11 is a graphical diagram illustrating a dynamic voltage response at a second clamp type (e.g., type B) according to one or more techniques of this disclosure for an ESD pulse. The abscissa axis (e.g., horizontal) of FIG. 11 represents time and the ordinate axis (e.g., vertical) of FIG. 11 represents a voltage 1102 across rails 116 and 118 of FIG. 1 for a system without active clamp deactivation, a voltage 1104 across rails 116 and 118 of FIG. 1 for a system configured for active clamp deactivation, and a voltage 1106 across rails 116 and 118 of FIG. 1 for a system configured for active clamp deactivation using turn-off delay circuitry. FIG. 11 is discussed with reference to FIGS. 1-7 for exemplary purposes only.

The example of FIG. 11 illustrates a simulated voltage drop across the active clamps under 2 kV HBM (according to JEDEC JS-001) ESD stress. As shown, voltages 1104 and 1106 substantially correspond to voltage 1102 for a system without active clamp deactivation. As such, FIG. 11 illustrates that a system configured for active clamp (e.g., type B) deactivation does not exhibit a significantly different voltage drop during ESD stress compared to systems that are not configured for active clamp deactivation.

Figure 12:
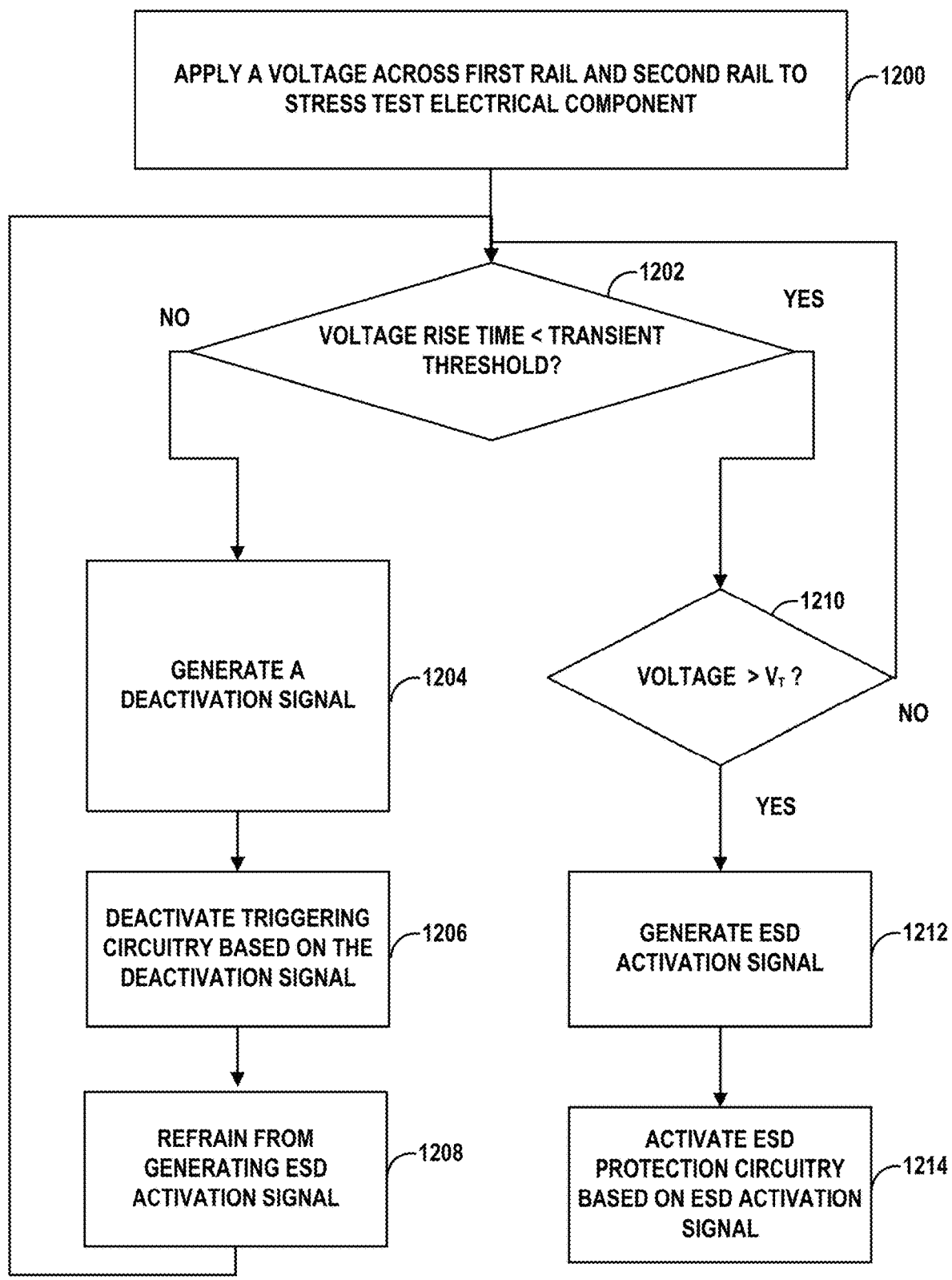
FIG. 12 is a flow chart illustrating an operation of an example ESD protection circuit according to one or more techniques of this disclosure.

FIG. 12 is a flow chart illustrating an operation of an example ESD protection circuit according to one or more techniques of this disclosure. FIG. 12 is discussed with reference to FIGS. 1-11 for exemplary purposes only.

In accordance with one or more techniques of this disclosure, testing voltage source 101 may apply a voltage across first rail 116 and second rail 118 to stress test electrical component 114 (1200). For example, testing voltage source 101 may be configured to output a voltage that increases, at a voltage change over time of less than 1/2 V/us, from a voltage at operating area 201 of FIG. 2 to a desired stress voltage is just below $V_{amr}$.

Transient detection circuitry 108 responds based on whether a voltage change over time exceeds a transient threshold (1202). For example, transient detection circuitry 108 may output a deactivation signal to deactivation circuitry 106 when a voltage change over time of a voltage across first rail 116 and second rail 118 does not exceed a transient threshold selected from a range of 10 volts per microsecond to 1V/10 ns. In some examples, transient detection circuitry 108 may refrain from outputting the deactivation signal to deactivation circuitry 106 when a voltage change over time of a voltage across first rail 116 and second rail 118 exceeds the transient threshold selected from a range of 10 volts per microsecond to 1V/10 ns.

In response to a voltage change over time that exceeds the transient threshold ("Yes" of 1202), triggering circuitry 104 responds based on whether a voltage at ESD protection circuitry 102 exceeds a nominal turn-on voltage of the ESD protection circuitry ($V_t$) (1210). In response to a voltage across first rail 116 and second rail 118 that does not exceeds the nominal turn-on voltage of the ESD protection circuitry ($V_t$) ("NO" of 1210), the process restarts to 1202. In response, however, to a voltage across first rail 116 and second rail 118 that exceeds the nominal turn-on voltage of the ESD protection circuitry ($V_t$) ("YES" of 1210), triggering circuitry 104 generates an ESD activation signal (1212) and ESD protection circuitry 102 activates based on the ESD activation signal (1214). For example, triggering circuitry 104 outputs an ESD activation signal into a control node of a pass element (e.g., pass element 322, pass element 422, etc.) of ESD protection circuitry 102 to activate (e.g., generates a channel that electronically couples first rail 116 and second rail 118) in response to receiving the ESD activation signal. In some examples, triggering circuitry 104 outputs an ESD activation signal to amplification circuitry 110 (e.g., amplification circuitry 510, amplification circuitry 610, etc.) in response to receiving the ESD activation signal. In this example, amplification circuitry 110 outputs, to a control node of a pass element of ESD protection circuitry 102, an amplified activation signal to drive ESD protection circuitry 102 to activate in response to receiving the ESD activation signal.

In response, however, to determining that the voltage change over time does not exceed the transient threshold ("No" of 1202), deactivation circuitry 106 generates a deactivation signal (1204). Deactivation circuitry 106 deactivates triggering circuitry 104 based on the deactivation signal (1206). For instance, deactivation circuitry 106 decouples triggering circuitry 104 from first rail 116 and/or second rail 118 in response to receiving the deactivation signal. In response to the deactivation signal, triggering circuitry 104 refrains from generating an ESD activation signal (1208) and the process restarts to 1202. For example, triggering circuitry 104 refrains from generating ESD activation signal for activating ESD protection circuitry 102 when the voltage across first rail 116 and second rail 118 exceeds a voltage threshold.

The following numbered examples demonstrate one or more aspects of the disclosure.

Example 1

A circuit comprising: electrostatic discharge (ESD) protection circuitry coupled between a first rail and a second rail; triggering circuitry configured to generate an ESD activation signal when a voltage across the first rail and the second rail exceeds a voltage threshold, wherein the ESD protection circuitry is configured to activate based on the ESD activation signal; transient detection circuitry configured to generate a deactivation signal when the voltage across the first rail and the second rail comprises a voltage change over time that is less than a transient threshold; and deactivation circuitry configured to deactivate the triggering circuitry based on the deactivation signal.

Example 2

The circuit of example 1, wherein the transient detection circuitry comprises: a resistance element; and a capacitor, wherein the capacitor is coupled in series with the resistance element.

Example 3

The circuit of any combination of examples 1 and 2, wherein the resistance element comprises one or more switching elements arranged in a series string.

Example 4

The circuit of any combination of examples 1-3, wherein the resistance element comprises one or more resistors.

Example 5

The circuit of any combination of examples 1-4, wherein: the deactivation circuitry comprises a switching element, the switching element comprising a control node, a first node, and a second node; a first node of the resistance element is coupled to the first node of the switching element; and a second node of the resistance element is coupled to the control node of the switching element and to a first node of the capacitor; and the second node of the switching element is coupled to the triggering circuitry.

Example 6

The circuit of any combination of examples 1-5, wherein a second node of the capacitor is coupled to the second rail.

Example 7

The circuit of any combination of examples 1-6, wherein the transient detection circuitry comprises turn-off delay circuitry, wherein a second node of the capacitor is coupled to an input of the turn-off delay circuitry and an output of the turn-off delay circuitry is coupled to the second rail.

Example 8

The circuit of any combination of examples 1-7, wherein the turn-off delay circuitry comprises one or more triggering elements arranged in a series string.

Example 9

The circuit of any combination of examples 1-8, wherein the one or more triggering elements comprise one or more of a Zener diode, a thyristor, a bipolar transistor, an avalanche diode, a metal-oxide-semiconductor (MOS) transistor and a forward biased diode.

Example 10

The circuit of any combination of examples 1-9, wherein: the ESD protection circuitry comprises a pass element, the pass element comprising a control node, a first node, and a second node; and the triggering circuitry comprises one or more triggering elements arranged in a series string, wherein the series string includes a first node coupled to the deactivation circuitry and a second node.

Example 11

The circuit of any combination of examples 1-10, wherein the one or more triggering elements comprise one or more of a Zener diode, a thyristor, a bipolar transistor, an avalanche diode, a metal-oxide-semiconductor (MOS) transistor and a forward biased diode.

Example 12

The circuit of any combination of examples 1-11, wherein the second node of the series string is coupled to the control node of the pass element.

Example 13

The circuit of any combination of examples 1-12, further comprising amplification circuitry configured to: receive the ESD activation signal from the triggering circuitry; generate an amplified activation signal based on the ESD activation signal; and output, to the control node of the pass element, the amplified activation signal.

Example 14

A method of operating electrostatic discharge (ESD) protection circuitry for an electrical component, the method comprising: generating a deactivation signal when a voltage across the first rail and the second rail comprises a voltage change over time that is less than a transient threshold; deactivating triggering circuitry based on the deactivation signal; and in response to deactivating the triggering circuitry, refraining from generating, by the triggering circuitry, an ESD activation signal for activating the ESD protection circuitry for the electrical component when the voltage across the first rail and the second rail exceeds a voltage threshold.

Example 15

The method of example 14, wherein generating the deactivation signal comprises charging a capacitor via a resistance element.

Example 16

The method of any combination of examples 14 and 15, wherein the resistance element comprises one or more switching elements arranged in a series string.

Example 17

The method of any combination of examples 14-16, wherein the resistance element comprises one or more resistors.

Example 18

The method of any combination of examples 14-17, further comprising: applying a voltage across the first rail and the second rail to stress test the electrical component.

Example 19

The method of any combination of examples 14-18, wherein applying the voltage across the first rail and the second rail comprises applying a voltage across the first rail and the second rail that exceeds the voltage threshold.

Example 20

An integrated circuit device comprising: an electrical component; electrostatic discharge (ESD) protection circuitry for preventing electrostatic discharge at the electrical component; triggering circuitry configured to generate an ESD activation signal for activating the ESD protection circuitry when a voltage at the electrical component exceeds a voltage threshold; transient detection circuitry configured to generate a deactivation signal when the voltage at the electrical component comprises a voltage change over time that is less than a transient threshold; and deactivation circuitry configured to deactivate the triggering circuitry based on the deactivation signal.

Various examples of the disclosure have been described. These and other examples are within the scope of the following claims.

The invention claimed is:

1. A circuit comprising:
   electrostatic discharge (ESD) protection circuitry coupled between a first rail and a second rail;
   triggering circuitry configured to generate an ESD activation signal when a voltage across the first rail and the second rail exceeds a voltage threshold, wherein the triggering circuitry comprises one or more active triggering elements arranged in a series string and wherein the ESD protection circuitry is configured to activate based on the ESD activation signal;

transient detection circuitry configured to generate a deactivation signal when the voltage across the first rail and the second rail comprises a voltage change over time that is less than a transient threshold; and deactivation circuitry configured to deactivate the triggering circuitry based on the deactivation signal.

2. The circuit of claim 1, wherein the transient detection circuitry comprises:
a resistance element; and
a capacitor, wherein the capacitor is coupled in series with the resistance element.

3. The circuit of claim 2, wherein the resistance element comprises one or more switching elements arranged in a series string.

4. The circuit of claim 2, wherein the resistance element comprises one or more resistors.

5. The circuit of claim 2, wherein:
the deactivation circuitry comprises a switching element, the switching element comprising a control node, a first node, and a second node;
a first node of the resistance element is coupled to the first node of the switching element; and
a second node of the resistance element is coupled to the control node of the switching element and to a first node of the capacitor; and
the second node of the switching element is coupled to the triggering circuitry.

6. The circuit of claim 5, wherein a second node of the capacitor is coupled to the second rail.

7. The circuit of claim 5, wherein the transient detection circuitry comprises turn-off delay circuitry, wherein a second node of the capacitor is coupled to an input of the turn-off delay circuitry and an output of the turn-off delay circuitry is coupled to the second rail.

8. The circuit of claim 7, wherein the series string is a first series string and wherein the turn-off delay circuitry comprises one or more second triggering elements arranged in a second series string.

9. The circuit of claim 8, wherein the one or more second triggering elements of the second series string comprise one or more of a Zener diode, a thyristor, a bipolar transistor, an avalanche diode, a metal-oxide-semiconductor (MOS) transistor and a forward biased diode.

10. The circuit of claim 1, wherein:
the ESD protection circuitry comprises a pass element, the pass element comprising a control node, a first node, and a second node; and
the series string includes a first node coupled to the deactivation circuitry and a second node.

11. The circuit of claim 10, wherein the one or more active triggering elements comprise one or more of a Zener diode, a thyristor, a bipolar transistor, an avalanche diode, a metal-oxide-semiconductor (MOS) transistor, and a forward biased diode.

12. The circuit of claim 10, wherein the second node of the series string is coupled to the control node of the pass element.

13. The circuit of claim 10, further comprising amplification circuitry configured to:
receive the ESD activation signal from the triggering circuitry;
generate an amplified activation signal based on the ESD activation signal; and
output, to the control node of the pass element, the amplified activation signal.

14. A method of operating electrostatic discharge (ESD) protection circuitry for an electrical component, the method comprising:
generating a deactivation signal when a voltage across a first rail and a second rail comprises a voltage change over time that is less than a transient threshold;
deactivating triggering circuitry based on the deactivation signal, wherein the triggering circuitry comprises one or more active triggering elements arranged in a series string; and
in response to deactivating the triggering circuitry, refraining from generating, by the triggering circuitry, an ESD activation signal for activating the ESD protection circuitry for the electrical component when the voltage across the first rail and the second rail exceeds a voltage threshold.

15. The method of claim 14, wherein generating the deactivation signal comprises charging a capacitor via a resistance element.

16. The method of claim 15, wherein the resistance element comprises one or more switching elements arranged in a series string.

17. The method of claim 15, wherein the resistance element comprises one or more resistors.

18. The method of claim 14, further comprising:
applying a voltage across the first rail and the second rail to stress test the electrical component.

19. The method of claim 18, wherein applying the voltage across the first rail and the second rail comprises applying a voltage across the first rail and the second rail that exceeds the voltage threshold.

20. An integrated circuit device comprising:
an electrical component;
electrostatic discharge (ESD) protection circuitry for preventing electrostatic discharge at the electrical component;
triggering circuitry configured to generate an ESD activation signal for activating the ESD protection circuitry when a voltage at the electrical component exceeds a voltage threshold wherein the triggering circuitry comprises one or more active triggering elements arranged in a series string;
transient detection circuitry configured to generate a deactivation signal when the voltage at the electrical component comprises a voltage change over time that is less than a transient threshold; and
deactivation circuitry configured to deactivate the triggering circuitry based on the deactivation signal.

* * * * *